(12) United States Patent
Lynch

(10) Patent No.: US 7,359,672 B2
(45) Date of Patent: Apr. 15, 2008

(54) APPARATUS AND METHOD FOR FREQUENCY CONVERSION

(75) Inventor: Jonathan J. Lynch, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/712,743

(22) Filed: Feb. 28, 2007

(65) Prior Publication Data

US 2007/0155355 A1    Jul. 5, 2007

Related U.S. Application Data

(62) Division of application No. 10/897,156, filed on Jul. 21, 2004, now Pat. No. 7,206,566.

(51) Int. Cl.
*H04B 7/14* (2006.01)
*H04B 1/26* (2006.01)

(52) U.S. Cl. .................. 455/7; 455/20; 455/193.3; 455/323; 257/471

(58) Field of Classification Search .............. 455/7, 455/15, 20, 303–331, 193.1–193.3; 257/471–483
See application file for complete search history.

(56) References Cited

U.S. PATENT DOCUMENTS 5,278,444 A * 1/1994 Lieneweg et al. .......... 257/476

5,809,409 A * 9/1998 Itoh et al. .................. 455/327
6,490,441 B1 * 12/2002 Saito .......................... 455/183.1
6,725,029 B1 * 4/2004 Allen .......................... 455/302
6,992,539 B1 * 1/2006 How ........................... 333/24.1
2002/0084932 A1 * 7/2002 Iwatani et al. ............... 342/175

OTHER PUBLICATIONS

Gresham, I., et al., "A Compact Manufacturable 76-77-Ghz Radar Module for Commercial ACC Applications," IEEE Transactions on Microwave Theory and Techniques, vol. 49, No. 1, pp. 44-58 (Jan. 2001).
Saglam, M., et al., "450 Ghz mm-Wave Signal From a Frequency Tripler With Heterostructure Barrier Varactors On Gold Substrate," Electronics Letters, vol. 38, No. 13, pp. 657-658 (Jul. 20, 2002).
Shaalan, M., et al., "First Design of a 430 Ghz Quasioptical HBV Tripler," Institut für Hochfrequenztechnik, pp. 47-50.

* cited by examiner

*Primary Examiner*—Simon Nguyen
(74) *Attorney, Agent, or Firm*—Ladas & Parry

(57) ABSTRACT

An apparatus for frequency up conversion and down conversion using frequency multiplier circuits. The frequency multiplier circuits receive a lower frequency signal and are operated in a forward direction to provide a higher frequency output. The same frequency multiplier circuits are operated in a reverse direction by receiving a higher frequency signal and producing a lower frequency output. The frequency multiplier circuits preferably use heterojunction barrier varactor diodes to eliminate the need for DC bias or idler circuitry.

3 Claims, 3 Drawing Sheets

APPARATUS AND METHOD FOR FREQUENCY CONVERSION

CROSS-REFERENCE TO RELATED APPLICATIONS

This patent application is a divisional application of U.S. Ser. No. 10/897,156, filed on Jul. 21, 2004 now U.S. Pat. No. 7,206,566.

BACKGROUND

1. Field

The present invention relates to translating lower frequency signals to higher frequency signals and higher frequency signals to lower frequency signals. More specifically, the present invention relates to an apparatus and method for up converting microwave signals to millimeter wave signals and down converting millimeter wave signals to microwave signals for use in such applications as a radar transceiver.

2. Description of Related Art

Communication and radar systems operating with signals in the microwave frequency band (3-30 GHz) are well-known in the art. Systems operating at higher frequencies are also known in the art. Such systems are often implemented using one or more transceivers that both transmit and receive the signals. Operating at higher frequencies is desirable because the size of the antennas used with the transceiver scale inversely with the operational frequency. As a result, higher frequencies result in smaller antennas while still realizing the same gain. This is important for applications that require a compact transceiver, such as in commercial vehicular applications. Higher frequencies also provide better Doppler resolution thus improving the quality of data transmitted and received.

Millimeter wave transceivers are typically designed with frequency multiplier stages immediately following the voltage controlled oscillator (VCO). As a result, all the components of the transceiver (mixers, amplifiers, etc.) must be operable at the higher multiplied frequency which increases the cost of the components. Furthermore, typical frequency multiplier stages comprise expensive active components that require complicated circuitry and introduce undesirable noise into the system.

FIG. 1 shows a prior art automobile radar system 200 for operation within the millimeter wave frequency band. The system 200 comprises an oscillator 210 operating at 19-19.25 GHz followed by a first amplifier 212. The amplified signal is then doubled in frequency by a first frequency multiplier 220. The doubled frequency signal is then amplified by a second amplifier 222. A second multiplier 230 then doubles the frequency of the signal to be at 76-77 GHz. A Microwave Monolithic Integrated Circuit (MMC) switch 240 is then used to switch the signal among multiple antenna elements 250 for transmission. A radar return signal is received by the antenna elements 250 and is directed to a mixer 260 by the MMIC switch 240. Since the transmitted signal is at 76-77 GHz, the mixer 260 uses a Local Oscillator signal at the same frequency to downconvert the radar return signal to an Intermediate Frequency (IF) signal. A low pass filter 262 is used to filter out signals at frequencies higher than that of the IF signal.

The system depicted in FIG. 1 illustrates some of the problems seen with transceiver systems known in the art. As can be seen from FIG. 1, multiple frequency multiplier stages are used after the voltage controlled oscillator to translate the oscillator signal at a microwave frequency to a signal in the millimeter wave frequency band. These components can impose considerable cost, size and power constraints on the system compared to components that need only operate at lower frequencies. Further, down conversion of the radar return is achieved with a mixer operating in the millimeter wave frequency band. Again, such components operating in the millimeter wave frequency band may cost considerably more, be larger than, and/or require more power than components that need only operate at lower frequencies.

Therefore, there is a need for an apparatus and method for sending and receiving signals at higher frequencies that can utilize components for lower frequency applications, while still providing the benefits of operation at higher frequencies.

SUMMARY

Frequency multipliers provide the ability to convert a signal at a first frequency to a signal at a second, higher, frequency. Similarly, frequency dividers provide the ability to convert a signal at a first frequency to a signal at a second, lower, frequency. According to embodiments of the present invention, a passive frequency multiplier is operated in a forward direction to produce an output signal that is at a frequency that is a multiple of the frequency of the input signal. The passive frequency multiplier is also operated in a reverse direction to produce an output signal that is at a frequency that is a fraction of the frequency of the input signal. Operation of a frequency tripler is described, but the passive frequency multiplier according to embodiments of the present invention may provide other harmonics of an input signal.

Embodiments of the present invention provide an apparatus for frequency up conversion and down conversion using frequency multiplier circuits. The frequency multiplier circuits receive a lower frequency signal and are operated in a forward direction to provide a higher frequency output. The same frequency multiplier circuits are operated in a reverse direction by receiving a higher frequency signal and producing a lower frequency output.

Transceivers according to embodiments of the present invention allow for the same circuitry to be used for both frequency up conversion and down conversion, resulting in significant savings in cost, complexity, size, weight, and other factors as compared to other transceivers known in the art. For example, a transceiver according to an embodiment of the present invention may use a passive frequency multiplier comprising a varactor diode. In the transceiver, the varactor diode, in combination with passive components, is disposed to provide for up conversion of a transmitted signal and down conversion of a received signal. A preferred embodiment of the present invention uses a heterojunction barrier varactor (HBV) diode in the passive frequency multiplier. Due to the use of the HBV diode, no DC bias or idler circuitry is required for the multiplier.

DETAILED DESCRIPTION

Figure 1:
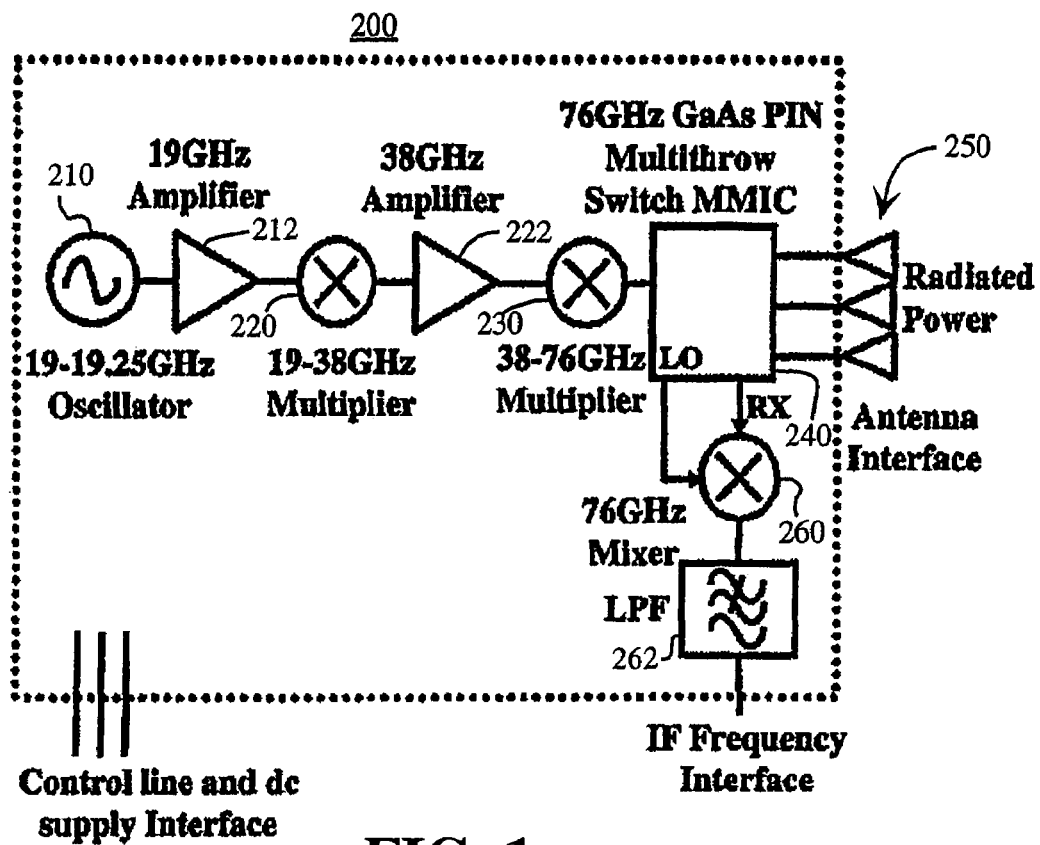
FIG. 1 (prior art) shows a simplified block diagram of an automobile radar system.

The present invention will now be described more fully hereinafter with reference to the accompanying drawings, in which preferred embodiments of the invention are shown. This invention may be embodied in many different forms and should not be construed as limited to the embodiments set forth herein. Further, the dimensions of certain elements shown in the accompanying drawings may be exaggerated to more clearly show details. The present invention should not be construed as being limited to the dimensional relations shown in the drawings, nor should the individual elements shown in the drawings be construed to be limited to the dimensions shown.

As shown in FIG. 1, up conversion from a microwave frequency signal to a millimeter wave frequency signal may be accomplished by using a series of frequency doublers. Up conversion from a microwave frequency signal (or from a lower frequency millimeter wave signal) to a higher frequency millimeter wave signal may also be accomplished by using one or more circuits that provide multiples of odd harmonics of a signal, e.g., frequency triplers. Frequency triplers may be realized using several different techniques, such as, for example, a Schottky diode tripler circuit.

Passive frequency multipliers according to embodiments of the present invention may also be configured so as to provide for frequency division. That is, rather than up converting an input signal to an output having a frequency that is a multiple of the input frequency, the circuit may be configured to provide an output that has a frequency that is a divisor of the input frequency, i.e., providing an output that is at a subharmonic of the input frequency. Further, as described below, a passive frequency multiplier may be configured in a bi-directional fashion to provide for frequency multiplication in one direction and frequency division in the opposite direction.

Figure 2:
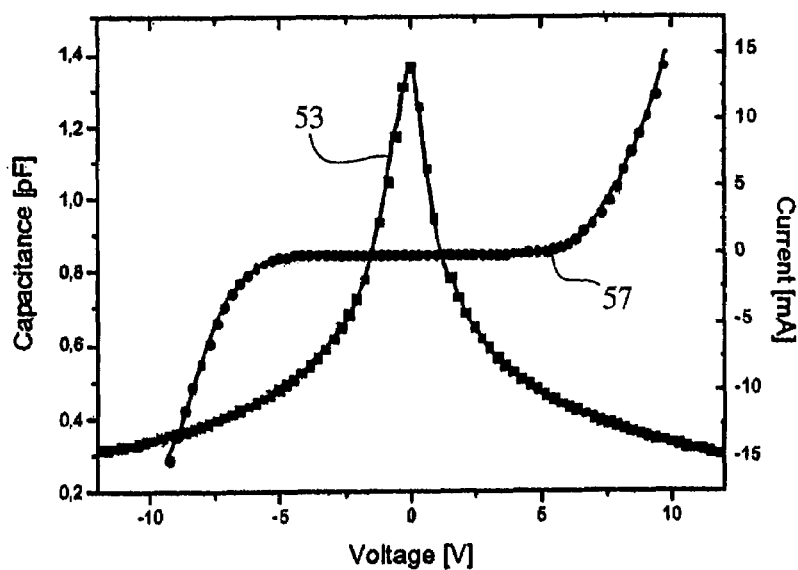
FIG. 2 shows the small signal C-V and I-V characteristics of a heterojunction barrier varactor.

Frequency multipliers according to embodiments of the present invention, such as frequency triplers, may be realized by using a heterojunction barrier varactor (HBV) diode. HBV diodes have a symmetric Capacitance (C) versus Voltage (V) characteristic and an anti-symmetric Current (I) versus Voltage (V) characteristic, although an HBV diode typically draws no appreciable current over the operating range of interest. FIG. 2 illustrates the C-V characteristic 53 and the I-V characteristic 57 for a typical HBV diode. HBV diodes are typically extremely small (tens of microns) and are easy to fabricate with very high yields. These diodes can be implemented using common semiconductor fabrication processes and typical semiconductor materials, such as Indium Phosphide (InP) or Gallium Arsenide (GaAs). See, for example, Saglam et al., "450 GHz mm-wave signal from a frequency tripler with heterostructure barrier varactors on gold substrate," ELECTRONICS LETTERS, 20 Jul. 2002, vol. 38, no. 13, pp. 657-658.

An advantage of HBV diode-based frequency multipliers is that no DC bias circuitry is required. A further advantage is that no idler circuitry is required for the even harmonics. These advantages provide that the circuitry in an HBV diode-based frequency multiplier may be simpler than other diode-based frequency multipliers, such as Schottky diode-based frequency triplers.

Figure 3:
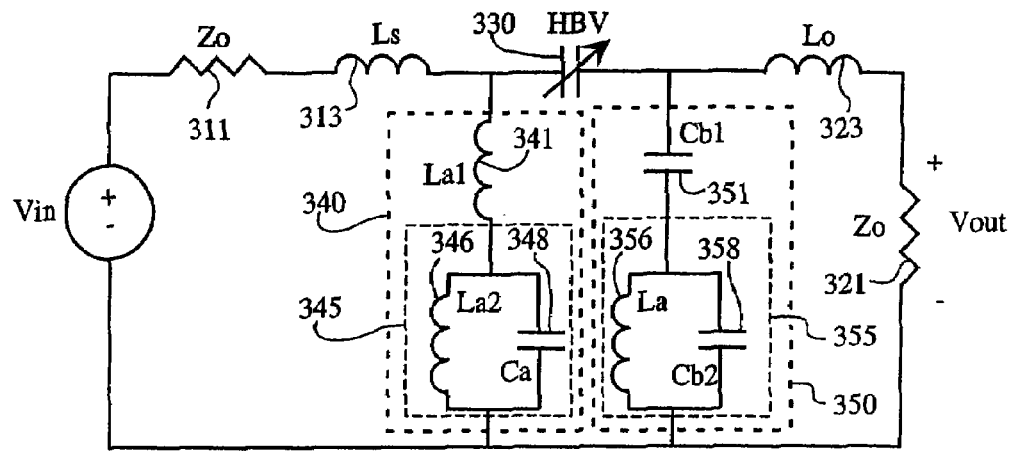
FIG. 3 shows a schematic of a HBV-based circuit that may be used as both a frequency multiplier and a frequency divider.

FIG. 3 presents a schematic diagram of an HBV diode-based frequency multiplier circuit 300 using lumped elements according to an embodiment of the present invention. Preferably, the circuit 300 presents an impedance match at both its input and its output. The impedance of the source is represented by a source impedance 311 having a value of Zo and the impedance at the output is represented by an output impedance 321 having a value of Zo. Using lumped elements, the inductances at the input and output of the multiplier circuit 300 are represented by lumped source inductance 313 having a value of Ls and a lumped output impedance 323 having a value of Lo.

As shown in FIG. 3, the HBV diode 330 requires no diode bias, so the terminals of the HBV diode 330 are connected in series with the source impedance 311 and the output impedance 321. For operation as a frequency tripler, the shunt LC network 340 at the input is configured to present an open circuit at the fundamental frequency $f_0$ and a short circuit at the triple frequency $3 f_0$. Similarly, the shunt LC network 350 at the output is configured to present a short circuit at the fundamental frequency $f_0$ and an open circuit at the triple frequency $3 f_0$. As shown in FIG. 3, the input shunt LC network 340 comprises an inductance 341 having a value of La1 in series with a first tank circuit 345 having an inductor 346 with value La2 in parallel with a capacitor 348 with value Ca. The output shunt LC network 350 comprises a capacitor 351 having a value of Cb1 in series with a second tank circuit 355 having an inductor 356 with value La in parallel with a capacitor 358 with value Cb2. However, those skilled in the art will understand that the input shunt LC network 340 and the output shunt LC network 350 may be realized using other configurations or distributions of elements.

The HBV diode-based tripler circuits are typically used just for that capability, that is, to provide an output signal which is triple the frequency of an input signal. However, the HBV tripler circuit shown in FIG. 3 may also be operated in reverse. When operated in the reverse manner, a signal inserted at the "output" end of the circuit having a frequency of $3 f_0$ will result in a signal being output at the "input" end of the circuit with a frequency of $f_0$. Therefore, a frequency multiplier circuit according to an embodiment of the present invention using an HBV diode also provides the capability of being a frequency divider circuit.

By choosing the element values of the shunt networks 340, 350 in FIG. 3 correctly, one can achieve input and output impedance matches and maximize the conversion efficiency for a given diode characteristic. Simulations indicate that for a typical HBV diode characteristic, such as $C_{max}/C_{min}$ ratio of 5 and a series resistance of 5 Ohms, the up conversion (multiplier by 3) efficiency is 84% and the down conversion (divider by 3) efficiency is 55%. Those skilled in the art will understand that operating a fabricated circuit at millimeter wave frequencies will result in loss mechanisms not included in the idealized analysis discussed above. Therefore, actual efficiencies will probably be much less. However, these idealized efficiencies and the related analysis demonstrate the applicability of HBV diode-based tripler circuits for both up conversion and down conversion.

Through the choice of the element values for the shunt networks 340, 350 of the circuit shown in FIG. 3, the circuit may also be configured to operate as a 5 times multiplier and a ⅕ divider. That is, by choosing the element values such that the shunt LC network 340 at the input is configured to present an open circuit at the fundamental frequency $f_0$ and a short circuit at the frequency $5 f_0$ and the shunt LC network 350 at the output is configured to present a short circuit at the fundamental frequency $f_0$ and an open circuit at the frequency 5 $f_0$, the circuit functions as a 5× multiplier and divider. However, the efficiency of the circuit will be less than that seen in the triple configuration. The operation of the circuit depicted in FIG. 3 may also be extended to other odd harmonics of the fundamental frequency through the proper choice of element values, but also with decreases in efficiency.

Figure 4:
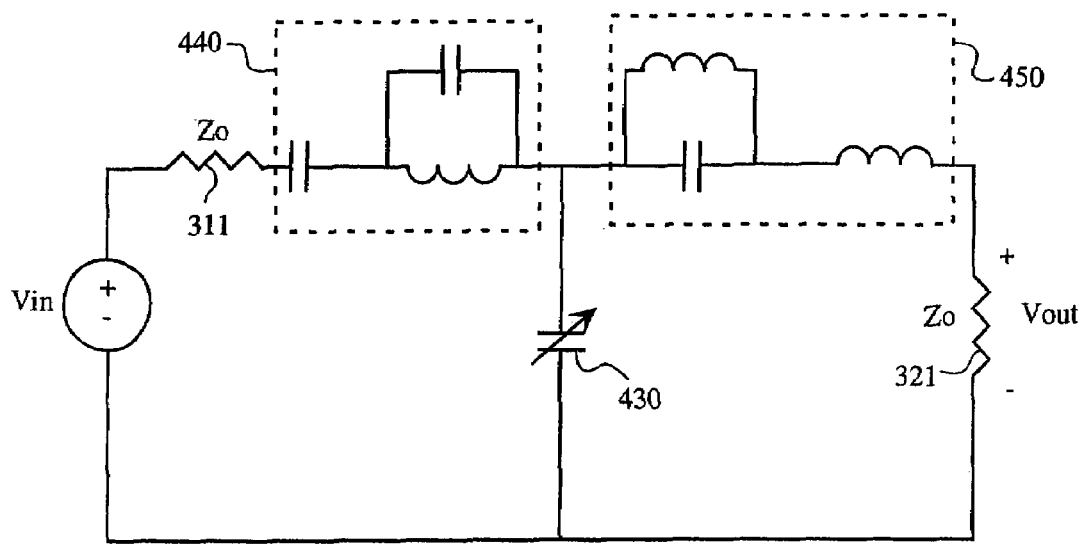
FIG. 4 shows a schematic of another HBV-based circuit that may be used as both a frequency multiplier and a frequency divider.

FIG. 4 shows a schematic of another HBV diode-based frequency multiplier/divider circuit 400. In FIG. 4, the HBV diode 430 is disposed as a shunt diode where the common terminal to a first series LC network 440 and a second series LC network 450. For operation as a frequency tripler, the first series LC network 440 is configured to present a short circuit at the fundamental frequency $f_0$ and an open circuit at the triple frequency 3 $f_0$ and the second series LC network 450 is configured to present an open circuit at the fundamental frequency $f_0$ and a short circuit at the triple frequency 3 $f_0$. Hence, a signal from Vin at the fundamental frequency $f_0$ will reach the HBV diode 430 for the generation of odd harmonics of the signal, but the signal at the fundamental frequency $f_0$ will be blocked from reaching Vout. Similarly, a signal at the triple frequency 3 $f_0$ presented at Vout will reach the BBV diode for the generation of odd subharmonics, but the signal at the triple frequency 3 $f_0$ will be blocked from reaching Vin. Hence, the circuit 400 provides for frequency multiplication by three in one direction and frequency division by three in the other direction.

Figure 5:
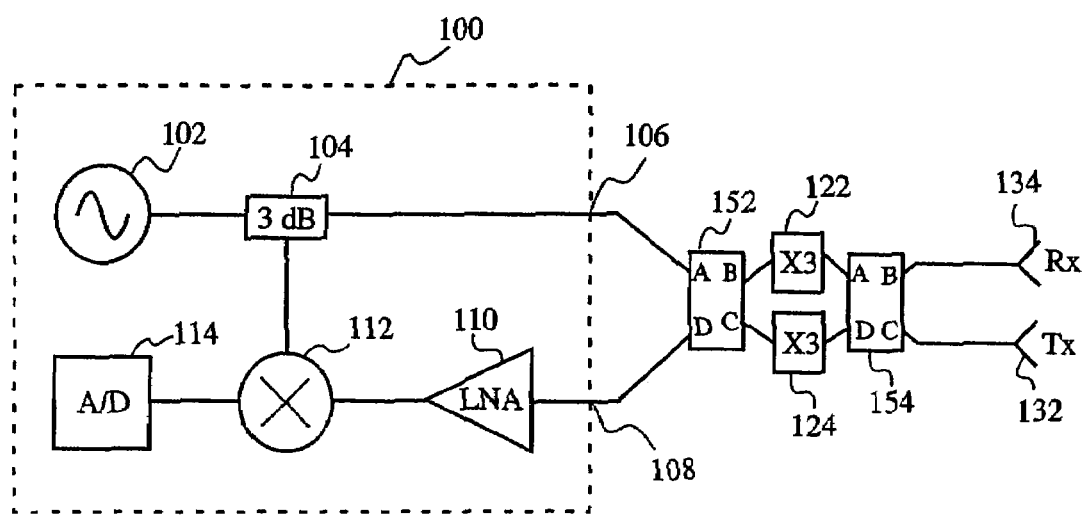
FIG. 5 shows a transceiver according to an embodiment of the present invention.

An embodiment of the present invention provides an apparatus used for the transmission and reception of electromagnetic signals. Preferably, the apparatus is operated to radiate and receive signals in the millimeter wave band. Shown in FIG. 5 is a schematic diagram of an apparatus that may be used in accordance with the present invention. The apparatus comprises a transceiver unit 100, two 180 degree couplers 152, 154, two frequency multiplier circuits 122, 124, a transmit antenna 132, and a receive antenna 134. The 180 degree couplers 152, 154 are preferably 180 degree hybrid couplers.

As discussed above, transceiver units in general are well-known. Therefore, the transceiver unit 100 may comprise a unit that is available as a commercial-off-the-shelf (COTS) unit. The transceiver unit 100 comprises a voltage-controlled oscillator (VCO) 102 that provides a modulated carrier signal at a selected frequency. For exemplary purposes only, the discussion below will refer to a 50 GHz transceiver, in other words, the VCO modulates the baseband signal onto a 50 GHz carrier signal. Those skilled in the art will realize that VCO's generating other frequencies are readily available and can be used with this invention.

The modulated signal may provide both the transmit signal from the transceiver unit 100 and a local oscillator signal used for internal down conversion of a received signal. The modulated signal is received by a coupler 104 that splits the signal into two outputs. The first output is coupled to the transmit port 106 of the transceiver unit 100 and the second output, acting as a local oscillator signal, is coupled to an internal mixer 112 of the transceiver unit 100. The internal mixer mixes the local oscillator signal with a signal received from the receive port of the transceiver unit 100 to produce a baseband signal. The baseband signal can then be converted to a digital signal by the analog-to-digital converter 114.

Those skilled in the art understand that the description of the transceiver unit 100 presented above describes a relatively simple transceiver unit 100. Other transceiver units known in the art may comprise other features, elements, and/or functions. However, such units may be generally characterized as modulating a baseband signal and producing a modulated transmit signal at a transmit port and receiving a modulated receive signal at a receive port and producing a demodulated baseband signal.

The transmit signal at the fundamental frequency $f_0$ exits the transceiver unit 100 via transmit port 106 where it is received by the first 180 degree coupler 152. The 180 degree coupler 152 is a four port bidirectional asymmetric coupling device that has the following scattering matrix [S]:

$$[S] = \frac{1}{\sqrt{2}} \begin{bmatrix} 0 & 1 & 1 & 0 \\ 1 & 0 & 0 & -1 \\ 1 & 0 & 0 & 1 \\ 0 & -1 & 1 & 0 \end{bmatrix}$$

Hence, the 180 degree coupler has a 180° difference at ports B and C when fed at port D and no phase difference between ports B and C when fed at port A. Therefore, the application of a transmit signal at port A of the first 180 degree coupler 152 will result in signals at ports B and C at the fundamental frequency $f_0$ having equal amplitude and equal phase, while there will be no output at port D. Preferably, the first 180 degree coupler 152 is chosen or configured for operation at and around the fundamental frequency $f_0$.

The two signals from the first 180 degree coupler are each coupled to a separate frequency multiplier circuits 122, 124 to provide for up conversion of the fundamental frequency $f_0$ to a multiple of the fundamental frequency, in this case, 3 $f_0$. The frequency multiplier circuits 122, 124 preferably comprise passive diode-based frequency multiplier circuits. More specifically, the passive diode-based frequency multiplier circuits 122, 124 preferably each comprise a HBV tripler circuit as described above. The HBV tripler circuit is preferred because it uses passive elements, which help reduce noise and it requires no DC bias source, thus maintaining circuit simplicity.

The outputs of the frequency multiplier circuits 122, 124 are coupled to the second 180 degree coupler 154. The second 180 degree coupler 154 is similar to the first coupler 152 in that it is also a four port bi-directional coupler having the scattering matrix described above. Preferably, the second 180 degree coupler 152 is chosen or configured for operation at and around the multiplied frequency 3 $f_0$. Due to the operation of the second 180 degree coupler 154, the outputs of the frequency multiplier circuits are added together at the coupler port connected to the transmit antenna 132 and are subtracted from each other at the port connected to the receive antenna 134. Thus, the transmit antenna 132 transmits a signal at the desired multiple of the fundamental frequency and no signal is output by the receive antenna 134. Therefore, if the frequency multiplier circuits 122, 124 are configured as tripler circuits, a 50 GHz carrier signal from the transceiver 100 will be output as a 150 GHz radiated signal.

Similarly, the receive antenna 134 may be configured to receive signals at the desired multiple of the fundamental frequency. The signal received by the receive antenna 134 is directed to the second 180 degree coupler 154, which splits the received signal into two signals at ports A and D that have an equal or nearly equal amplitude, but are 180 degrees out of phase with each other. These signals are then coupled to the frequency multiplier circuits 122, 124, which, due to their bi-directional capability, provide for down conversion of the received signals to the fundamental frequency. The down converted outputs of the frequency multiplier circuits 122, 124 are then directed to the first 180 degree coupler 152. The first 180 degree coupler 152 provides that the down converted received signals will be added and output by the coupler 152 at port D, while any signals received by the transmit antenna 132 flowing back through the system will be subtracted from each other and not output at port D of coupler 152.

The down-converted received signal from the first coupler 152 enters the transceiver 100 through the receive port 108. The use of a HBV diode-based frequency multiplier circuit may introduce insertion loss, which may decrease the sensitivity of the transceiver 100. To alleviate this problem, a low noise amplifier (LNA) 110 may be used to amplify the received signal output from the first coupler 152. Of course, the use of a LNA operating at high frequencies may increase the cost, size, and/or power requirements of the circuit or result in other limitations. As an alternative, no amplifier may be used and the reduced sensitivity is accepted as a tradeoff for reduced costs. As discussed above, the transceiver 100 mixes the down-converted received signal with the local oscillator signal to produce a baseband signal.

The embodiment of the present invention described above presents a transceiver, which may normally operate at a frequency of 50 GHz, that can be reconfigured to operate at 150 GHz through the use of relatively low cost diode-based frequency multiplier circuits. As described above, HBV diode-based frequency multiplier circuits can be configured to operate as frequency triplers or as other odd harmonic multipliers and dividers, providing for transceiver operation at even higher frequencies.

Although the transceiver 100 has been described above in terms of incorporating the frequency multiplier circuits depicted in FIGS. 3 and 4, other frequency multipliers and dividers may be used in accord with the present invention.

From the foregoing description, it will be apparent that the present invention has a number of advantages, some of which have been described herein, and others of which are inherent in the embodiments of the invention described herein. Also, it will be understood that modifications can be made to the apparatus and method for frequency up-conversion and down conversion described herein without departing from the teachings of the subject matter described herein. As such, the invention is not to be limited by the described embodiments except as required by the appended claims.

What is claimed is:

1. A passive frequency conversion device comprising:
    a first filter circuit having a first filter first port and a first filter second port;
    a second filter circuit having a second filter first port and a second filter second port; and
    a heterojunction barrier varacter diode coupled to the first filter second port and the second filter first port,
    wherein the device is configured such that a signal at a first frequency coupled to the first filter first port is output at the second filter second port at a second frequency and a signal at the second frequency coupled to the second filter second port is output at the first filter first port at the first frequency.

2. The frequency conversion device according to claim 1, wherein the heterojunction barrier varacter diode has a first diode terminal and a second diode terminal, the first filter second port is coupled to the first diode terminal, and the first filter circuit is configured to present an open circuit at the first frequency and a short circuit at the second frequency, and the second filter first port is coupled to the second diode terminal, and the second filter circuit is configured to present a short circuit at the first frequency and an open circuit at the second frequency, wherein the second frequency is an odd harmonic of the first frequency.

3. The frequency conversion device according to claim 1, wherein the heterojunction barrier varacter diode is configured as a shunt diode, the shunt diode having a common terminal, and wherein the first filter second port is coupled to the common terminal, and the first filter circuit is configured to present a short circuit at the first frequency and an open circuit at the second frequency, and the second filter first port is coupled to the common terminal, and the second filter circuit is configured to present an open circuit at the first frequency and a short circuit at the second frequency, wherein the second frequency is an odd harmonic of the first frequency.

* * * * *